US008107233B2

(12) United States Patent
Alo et al.

(10) Patent No.: US 8,107,233 B2
(45) Date of Patent: Jan. 31, 2012

(54) LATCHING SYSTEM FOR MULTIPLE NODES OF A COMPUTER SYSTEM

(75) Inventors: Roland K. Alo, Raleigh, NC (US); Richard M. Barina, Sebring, FL (US); Norman Bruce Desrosiers, Oxford, NC (US); Daniel P. Kelaher, Holly Springs, NC (US); James S. Womble, Hillsborough, NC (US)

(73) Assignee: International Business Machines Corporation, Armonk, NY (US)

( * ) Notice: Subject to any disclaimer, the term of this patent is extended or adjusted under 35 U.S.C. 154(b) by 148 days.

(21) Appl. No.: 12/480,998

(22) Filed: Jun. 9, 2009

(65) Prior Publication Data

US 2010/0308189 A1    Dec. 9, 2010

(51) Int. Cl.
*G06F 1/16* (2006.01)

(52) U.S. Cl. ............... 361/679.37; 248/694; 211/41.12; 361/679.39; 361/679.58; 361/801

(58) Field of Classification Search ............ 248/298.1, 248/694; 211/41.12, 41.17; 361/679.37, 361/679.39, 679.43, 679.58, 801, 810
See application file for complete search history.

(56) References Cited

U.S. PATENT DOCUMENTS

| | | | |
|---|---|---|---|
| 5,259,783 A | | 11/1993 | Hileman et al. |
| 5,268,821 A * | | 12/1993 | Wong ................ 361/796 |
| 5,319,520 A | | 6/1994 | Sugiyama et al. |
| 6,208,514 B1 * | | 3/2001 | Stark et al. ................ 361/704 |
| 6,269,007 B1 * | | 7/2001 | Pongracz et al. ............. 361/759 |
| 6,693,800 B1 | | 2/2004 | Lin et al. |
| 6,765,803 B2 | | 7/2004 | Farnworth et al. |
| 6,809,922 B2 * | | 10/2004 | Lin et al. .................... 361/679.4 |
| 6,885,566 B2 * | | 4/2005 | Chen ........................... 361/802 |
| 7,036,783 B2 * | | 5/2006 | Chen et al. .................. 248/298.1 |
| 7,180,755 B1 * | | 2/2007 | Reznikov ..................... 361/797 |
| 7,495,909 B1 * | | 2/2009 | Chen et al. ............... 361/679.37 |
| 7,542,281 B2 * | | 6/2009 | Liang et al. .............. 361/679.39 |
| 7,652,879 B2 * | | 1/2010 | Hartman et al. .......... 361/679.39 |
| 7,760,495 B2 * | | 7/2010 | Li ............................. 361/679.37 |
| 2002/0060197 A1 * | | 5/2002 | Tabuchi ..................... 211/41.17 |
| 2005/0087504 A1 * | | 4/2005 | Wu ................................ 211/26 |
| 2005/0254210 A1 | | 11/2005 | Grady et al. |
| 2006/0034048 A1 * | | 2/2006 | Xu ................................ 361/685 |
| 2006/0245158 A1 * | | 11/2006 | Chen et al. .................... 361/685 |
| 2007/0217142 A1 * | | 9/2007 | Wagatsuma et al. .......... 361/685 |
| 2007/0217143 A1 * | | 9/2007 | Wagatsuma et al. .......... 361/685 |
| 2009/0168326 A1 * | | 7/2009 | Chen et al. ............... 361/679.39 |
| 2009/0273900 A1 * | | 11/2009 | Liu ........................... 361/679.58 |

* cited by examiner

*Primary Examiner* — Terrell McKinnon
*Assistant Examiner* — Bradley Duckworth
(74) *Attorney, Agent, or Firm* — Lieberman & Brandsdorfer, LLC

(57) ABSTRACT

A method and system to support simultaneous unlatching from a rack of two or more adjacently mounted and vertically aligned hardware components. One interface bracket is secured to one vertical rail of the rack, and a second interface bracket is secured to a second vertical rail of the rack on an opposite side of the rack. A set of latches are provided in communication with each interface bracket, with the number of latches corresponding to the number of hardware components in communication with the interface bracket. Actuation of one of the latches releases fastening of at least one hardware components from the rack, and accommodates removal of the release component from the rack.

18 Claims, 6 Drawing Sheets

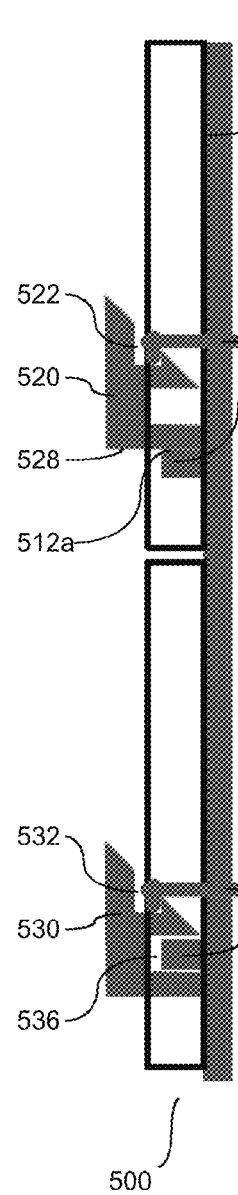
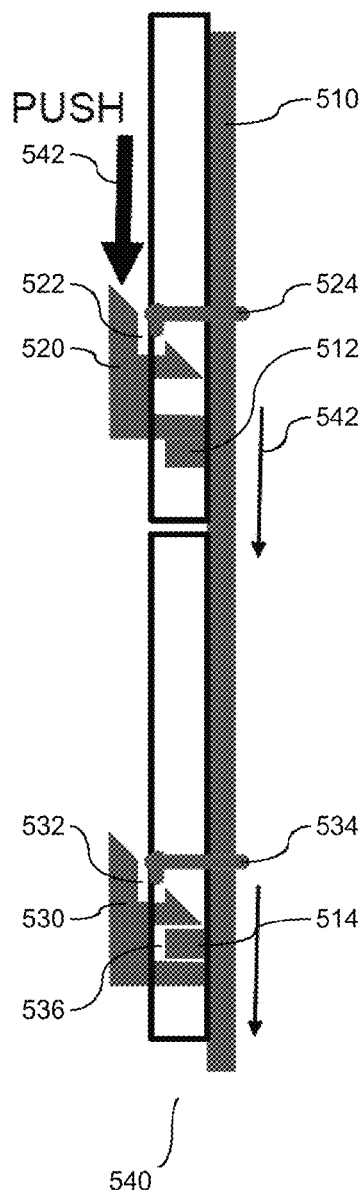
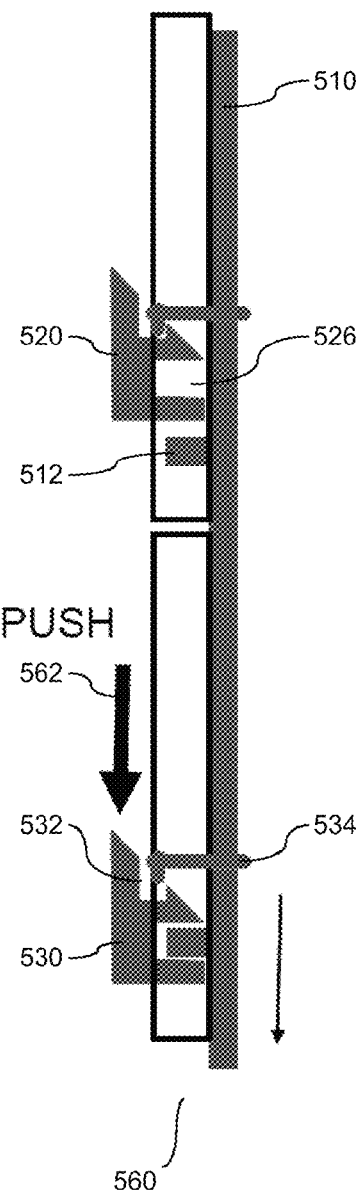

US 8,107,233 B2

LATCHING SYSTEM FOR MULTIPLE NODES OF A COMPUTER SYSTEM

BACKGROUND OF THE INVENTION

1. Technical Field

This invention relates to release of computer hardware components from a rack. More specifically, the invention relates to a mechanism to facilitate selective removal of one or more connected hardware components from the rack.

2. Description of the Prior Art

A computer rack, which is sometimes referred to as a rack, is a metal frame used to hold various hardware devices such as servers, hard disk drives, modems and other electronic equipment. More specifically, the computer rack resembles a shelving structure where components can be attached vertically, and stacked on top of one another. The racks include metal strips with spaced holes to secure the apparatus stored in the rack to the rack itself. In many electronics racks, 1.75 inches of height is the standard rack mounting unit.

While racks come in many different shapes and sizes, the standard (traditional) size rack is 19-inches wide. Racks are usually made of aluminum or steel. The Electronics Industries Association (EIA) establishes standards for cabinets and racks intended for use with computers and other electronic equipment.

Scalable computer systems are becoming more modular in design by having compute nodes, storage nodes, I/O drawers, etc., all of which can be mounted on a rack. By connecting multiple compute nodes together, a collection of systems can be run as a large system for compute intensive workloads. Conversely, the multiple compute nodes can be compartmentalized into a plurality of virtual systems to perform a variety of tasks. Regardless of the operation of the computer node, they must be connected via some form of a cable with a fixed length so that they can operate individually or together as part of a larger system.

One of the benefits of use of the rack-mounted systems on sliderails is the ease of removal and installation of a node from the rack. Each individual node is capable of being installed, configured, and serviced as a single node system. However, for nodes that operate on a non-individual basis, i.e. in conjunction with a second node, there is a need for a tool that enables a plurality of nodes to be pulled out of the rack as a single unit to facilitate removal and servicing of the multi-node system. A bracket may be employed to secure multiple nodes. However, use of the bracket requires the individual nodes to be latched and unlatched simultaneously. In a two node configuration, this requires four hands.

Accordingly, there is a need in the art for a method and system to secure multiple nodes together that accommodates an individual or joint removal of the nodes from a rack.

SUMMARY OF THE INVENTION

This invention comprises a system and method to support simultaneous release of a fastening of two or more hardware components from a rack.

In one aspect of the invention, a system is provided to facilitate the simultaneous release of two or more adjacently and vertically mounted hardware components. A rack is provided with two opposing sides to hold at least a first hardware component adjacently mounted in a vertical manner to a second computer hardware component. To accommodate the release, a first interface bracket is provided and fixed to a first rail of a first side of the rack. The first interface bracket has a first projection and a second projection both perpendicular to the rail, with the first projection adjacent to the first hardware component and the second projection adjacent to the second hardware component. A first release latch is provided having a first aperture adapted to interface with the first projection and a second aperture to receive a first latch from the first hardware component. In addition, a second release latch is provided having a third aperture adapted to interface with the second projection and a fourth aperture to receive a second latch from the second hardware component.

In another aspect of the invention, a method is provided for simultaneously unlatching two or more hardware components from a rack. Two or more adjacent hardware components are vertically mounted to a second hardware component in a vertical manner in a rack having two opposing sides. A first interface bracket is fixed to a first rail of a first side of the rack. The first interface bracket has a first projection and a second projection both perpendicular to the rail, with the first projection adjacent to the first hardware component and the second projection adjacent to the second hardware component. A first release latch is in communication with the interface and the first hardware component. The first release latch includes a first aperture adapted to interface with the first projection and a second aperture receiving a first latch from the first hardware component. A second release latch is in communication with the interface and the second hardware component. The second release latch includes a third aperture adapted to interface with the second projection and a fourth aperture receiving a second latch from the second hardware component.

Other features and advantages of this invention will become apparent from the following detailed description of the presently preferred embodiment of the invention, taken in conjunction with the accompanying drawings.

BRIEF DESCRIPTION OF THE DRAWINGS

The drawings referenced herein form a part of the specification. Features shown in the drawing are meant as illustrative of only some embodiments of the invention, and not of all embodiments of the invention unless otherwise explicitly indicated. Implications to the contrary are otherwise not to be made.

FIGS. 5a, 5b, and 5c are schematic side views of the employment of the latch together with the interface bracket to limit release from the rack of a single hardware component.

DESCRIPTION OF THE PREFERRED EMBODIMENT

Figure 1:
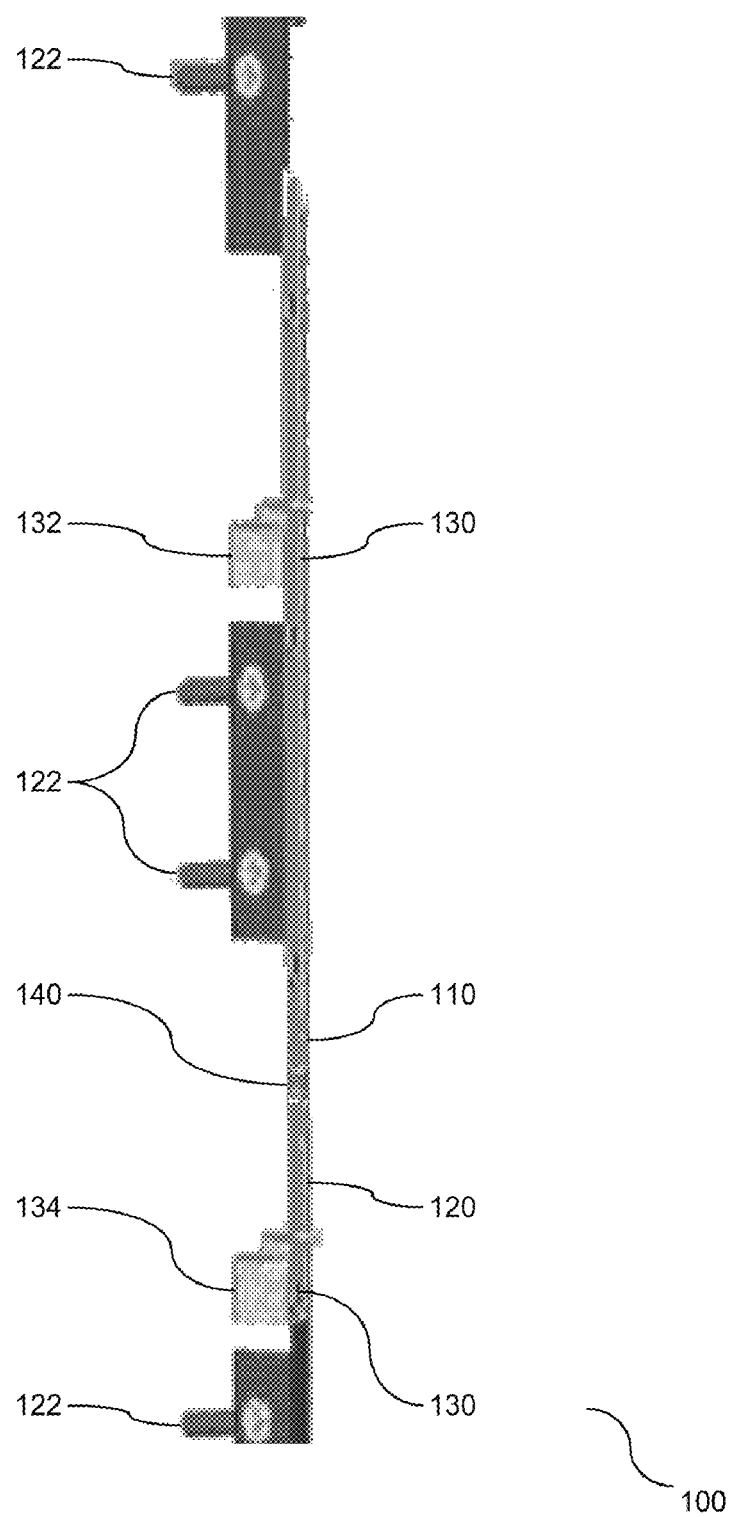
FIG. 1 is an isometric view (100) of a first part of a two part interfacing bracket.

It will be readily understood that the components of the present invention, as generally described and illustrated in the Figures herein, may be arranged and designed in a wide variety of different configurations. Thus, the following detailed description of the embodiments of the apparatus, system, and method of the present invention, as presented in the Figures, is not intended to limit the scope of the invention, as claimed, but is merely representative of selected embodiments of the invention.

Reference throughout this specification to "a select embodiment," "one embodiment," or "an embodiment" means that a particular feature, structure, or characteristic described in connection with the embodiment is included in at least one embodiment of the present invention. Thus, appearances of the phrases "a select embodiment," "in one embodiment," or "in an embodiment" in various places throughout this specification are not necessarily referring to the same embodiment.

Furthermore, the described features, structures, or characteristics may be combined in any suitable manner in one or more embodiments. In the following description, numerous specific details are provided, such as examples of interface brackets, projections, latches, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

The illustrated embodiments of the invention will be best understood by reference to the drawings, wherein like parts are designated by like numerals throughout. The following description is intended only by way of example, and simply illustrates certain selected embodiments of devices, systems, and processes that are consistent with the invention as claimed herein.

Overview

Two or more hardware components are mounted in a vertical rack. A bracket system is provided to facilitate release of two or more adjacently mounted hardware components in a simultaneous manner. The bracket system is comprised of a two part interface bracket, and a latch mechanism that employs one latch for each hardware component. Each of the latches secures to both the interface bracket and to one of the hardware components. The bracket system is duplicated such that there is one bracket system on opposite sides of a vertical rack, to support release of the fastening of the hardware component secured to two sides of the rack.

Technical Details

In the following description of the embodiments, reference is made to the accompanying drawings that form a part hereof, and which shows by way of illustration the specific embodiment in which the invention may be practiced. It is to be understood that other embodiments may be utilized because structural changes may be made without departing form the scope of the present invention.

Figure 6:
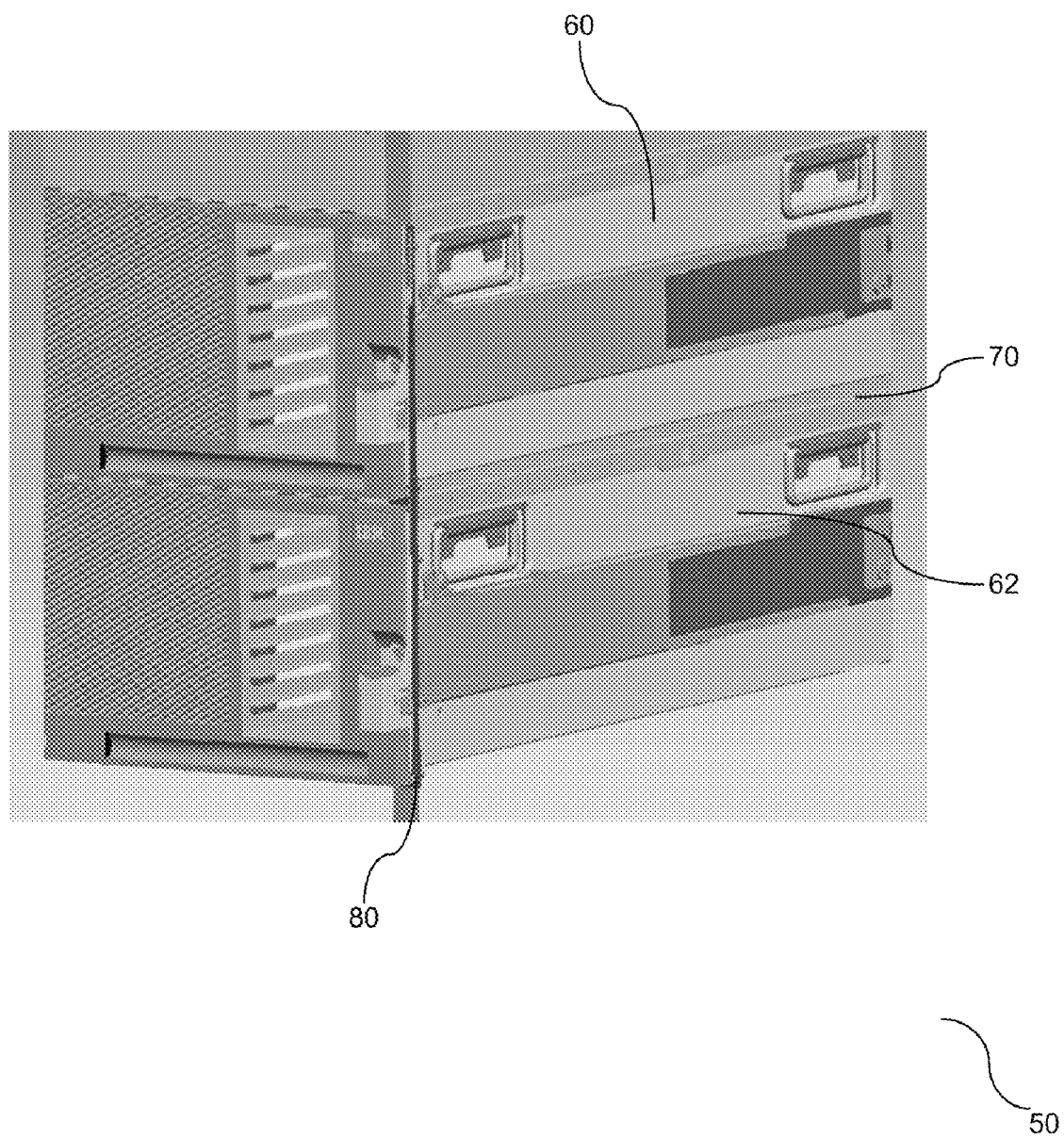
FIG. 6 is a form isometric view of hardware components mounted in a rack cabinet.

FIG. 6 is a front isometric view (50) of two hardware components (60) and (62) adjacently mounted in a rack cabinet (70), also referred to herein as a rack. As shown, the two hardware components (60) and (62) are vertically mounted in the rack (70). An interfacing bracket (80) is secured to the rack (70) and is in communication with the two hardware components (60) and (62). Details of the interfacing bracket (80), associated functionality, and interaction with the hardware components (60) and (62) are described below.

To accommodate either a joint or individual removal of adjacently stacked hardware components on a rack, a two part mechanism is provided. FIG. 1 is an isometric view (100) of a first part of the two part mechanism hereinafter referred to as an interfacing bracket. More specifically and as shown, the interfacing bracket (110) is provided and configured to be secured to the vertical rails of the rack. The interfacing bracket (110) is comprised of two components; a first component is a vertical rail (120) that secures to the vertical rail of the rack through a securing mechanism (122). As shown herein, the vertical rail of the interfacing bracket secured to the rack at multiple locations. In one embodiment, the vertical rails may include a larger quantity or smaller quantity of attachments to the rack. The invention should not be limited to the quantity of attachments shown herein. Furthermore, in one embodiment, the securing mechanism may be in the form of a screw, or alternative mechanical element configured to mechanically attach the vertical rail of the interfacing bracket to the vertical rail of the rack. A second component (130) of the interfacing bracket (110) is a set of projections (132) and (134) that are employed to facilitate release of the hardware components from the rack. Projections (132) and (134) are connected together along the interfacing bracket (110) and are configured to slide along the vertical rail (120). More specifically, in one embodiment, a spring (140) is embedded in the vertical rail (120) to hold projections (132) and (134) in tension. Accordingly, the interfacing bracket is employed to directly interface with the rack.

Figure 2:
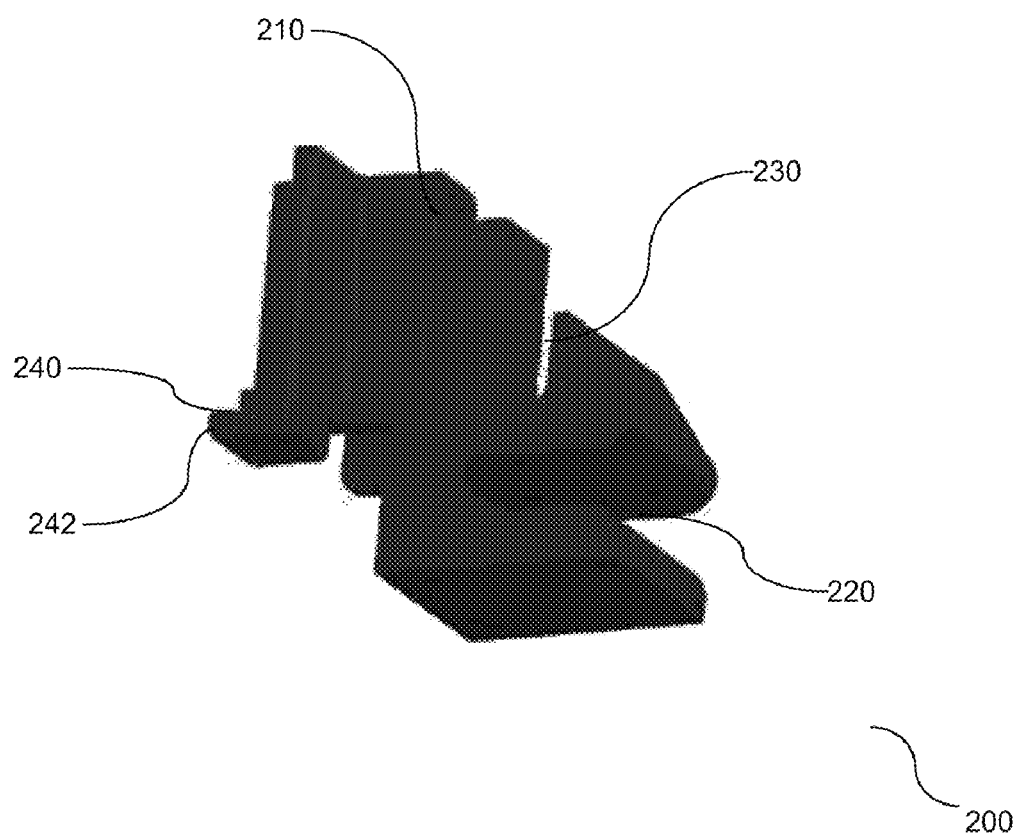
FIG. 2 is an isometric view of a latch configured to communicate with the interfacing bracket and a mounted hardware component.

A second mechanism to accommodate either a joint or individual removal of adjacently stacked hardware components on a rack is a latch provided to interface with both the interfacing bracket and the hardware components mounted in the rack. FIG. 2 is an isometric view of the latch (200). As shown, the latch includes a body (210) that is provided with two openings. A first opening (220) is sized to receive one of the projections (132) and (134) from the interfacing bracket (110). A second opening (230) is sized to receive a hardware component extension, hereinafter referred to as an extension, from a hardware component mounted in the rack. In one embodiment, the extension from the hardware component is known in the art, and as such, the second opening is designed and sized for receipt of the extension. For example, in one embodiment, the hardware component extension latch includes a horizontal extension with a vertical downward projection at a distal end of the horizontal extension. In the example shown herein, the second opening (230) is configured to receive the downward projection of the hardware component extension. However, in an embodiment with a different configuration of the hardware component extension or the distal end thereof, the second opening (230) may comprise a different configuration to receive the hardware component extension. In addition to the two openings (220) and (230), a handle (not shown) is provided with the latch (200). The handle (not shown) is shown placed opposite the two openings (220) and (230) to enable actuation of the latch (200). In one embodiment, the handle (not shown) includes a projection to facilitate actuation of the handle (240). In one embodiment, the handle projection (242) may have a different shape or profile to facilitate actuation thereof and should not be limited to the shape and profile shown herein. Furthermore, in one embodiment, the handle projection (242) may be placed on a different wall or surface of the handle (not shown), and as such, the invention should not be limited to the location shown herein. Accordingly, the handle is provided with at least two apertures (220) and (230) sized and configured to receive a projection from the interfacing bracket (110) and an extension from the hardware component, respectively.

Figure 3:
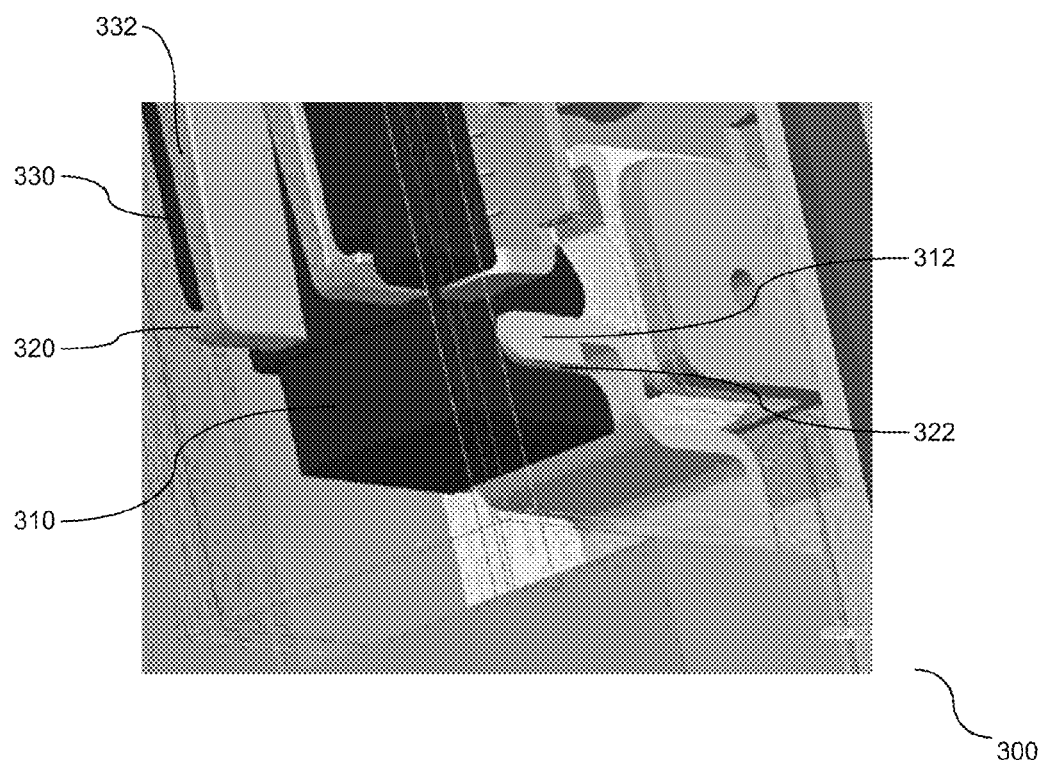
FIG. 3 is a perspective view of the latch in communication with the interfacing bracket, according to the preferred embodiment of this invention, and is suggested for printing on the first page of the issued patent.

As discussed with reference to FIG. 2, the latch is configured with at least two openings, with each opening sized and configured to receive two projections, one from the interface bracket and a second from the hardware component mounted in the rack. FIG. 3 is a perspective view (300) of the latch in communication with the interfacing bracket. More specifically, a lower portion of the body of the interfacing bracket is shown, as well as a portion of the latch (320) emanating from the interface bracket. As shown in FIG. 1, the interfacing bracket is provided with at least two projections, one for each hardware component mounted in the rack. Each latch is sized and configured to communicate with the interface bracket for a single hardware component mounted in the rack. As shown herein, a projection (312) from the interface bracket is shown received in the lower aperture (322) of the latch (320). An opposite facing wall (330) of the latch (320) with respect to the surface of the interface bracket is provided with a handle, a portion of which is shown at (332). Accordingly, the receipt of the projection (312) by the lower aperture (322) of the latch (320) enables the latch (320) to communicate with the interface bracket.

Figure 4A:
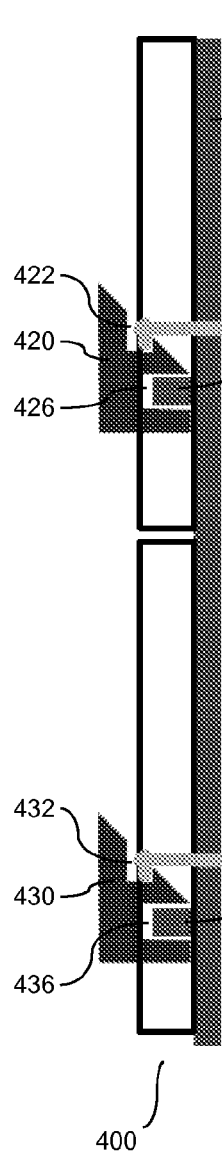
FIGS. 4a, 4b, and 4c are schematic side views of the employment of the latch together with the interface bracket to simultaneously release two hardware components from a rack.

As described above, there are three essential elements to the latch mechanism disclosed herein: the interface bracket, the latch, and the hardware component mounted in the rack. The interface bracket secures to the rack, and the latch secures to both the interface bracket and one of the hardware components mounted in the rack. FIG. 4a is a schematic side view (400) of the employment of the latch together with the interface bracket to simultaneously release two hardware components from the rack. More specifically, the view shown in FIG. 4a is a closed view with each of the hardware components secured in the rack. As shown, the interface bracket (410) has a first projection (412), referred to in FIG. 1 at (132), and a second projection (414), referred to in FIG. 1 at (134). The first projection (412) is mounted adjacent to a first hardware component (not shown), and the second projection is mounted adjacent to a second hardware component (not shown). As described above in detail, each latch includes two apertures, one to communicate with the interface bracket (410) and the second to interface with the hardware component. A first latch (420) is shown with a first aperture (422) and a second aperture (426). The first aperture (422) is sized to receive a projection (424) from the first hardware component (not shown), and the second aperture (426) is sized to receive the first projection (412) from the interface bracket (410). A second latch (430) is shown with a first aperture (432) and a second aperture (436). The first aperture (432) is sized to receive a projection (434) from the second hardware component (not shown), and the second aperture (436) is sized to receive the second projection (414) from the interface bracket (410). Accordingly, in this closed view both apertures of both latches are shown in receipt of the respective projections of the interface bracket and the associated hardware component in the rack.

Figure 4B:
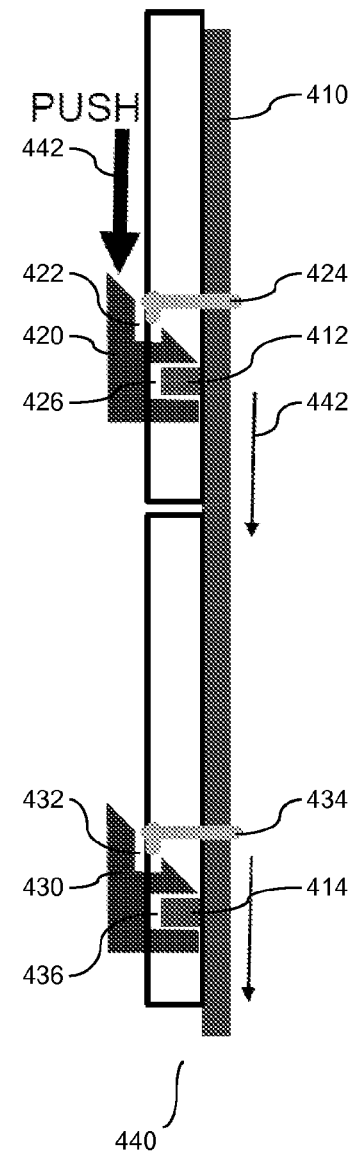

FIG. 4b is a schematic side view (440) of the latch together with the interface bracket simultaneously releasing the fastening of two hardware components from the rack. In this view, the first latch (420) has been actuated in the form of a push in the downward direction (442). By actuating the first latch (420), the first latch is moved in a downward direction. At the same time, the interface bracket (410) moves the second latch (430) in the downward direction by sliding along the vertical rail (120) of the interface bracket (410), as described in detail in FIG. 1. Movement of both the first and second latches (420) and (430), respectively, causes a release of the projections (424) and (434), respectively, from the first apertures (422) and (432) of the first and second latches (420) and (430), respectively. At the same time, the first and second latches (420) and (430) each remain in communication with the interface bracket (410) by retaining the first projection (412) and the second projection (414) in the first and second apertures (426) and (436), respectively. Accordingly, actuation of the first latch (420) simultaneously actuates the second latch (430) to release the fastening of the computer hardware component from the rack.

Figure 4C:
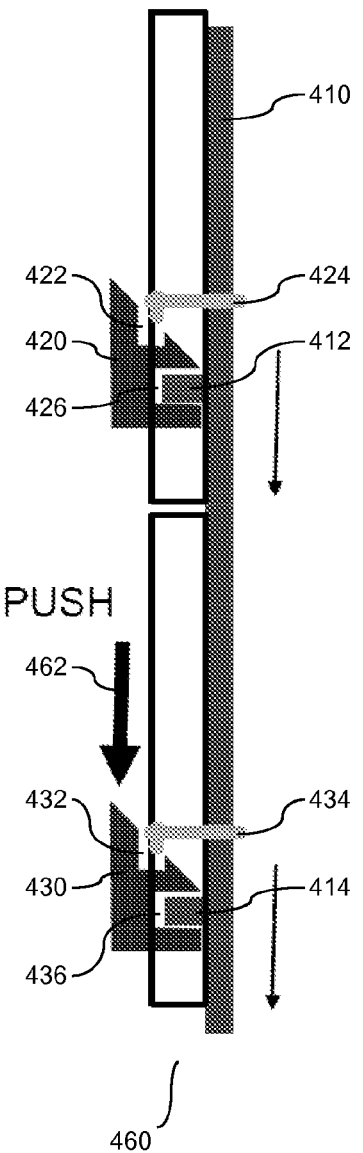

FIG. 4c is a schematic view (460) of the latch together with the interface bracket simultaneously releasing the fastening of two hardware components from the rack by actuating the second latch. In this view, the second latch (430) has been actuated in the form of a push in the downward direction (462). By actuating the second latch (430), the second latch is moved in a downward direction. At the same time, the interface bracket (410) moves the first latch (420) in the downward direction by the sliding along the vertical rail (120) of the interface bracket (410), as described in detail in FIG. 1. Movement of both the first and second latches (420) and (430), respectively, causes a release of the projections (424) and (434), respectively, from the first apertures (422) and (432) of the first and second latches (420) and (430), respectively. At the same time, the first and second latches (420) and (430) each remain in communication with the interface bracket (410) by retaining the first projection (412) and the second projection (414) in the first and second apertures (426) and (436), respectively. Actuation of the second latch (430) simultaneously actuates the first latch (420) to release the fastening of the computer hardware component from the rack. Accordingly, release of the fastening of the computer hardware components from the rack is not limited to any one of the latches in communication with both the interface bracket (410) and the projection from the respective hardware component.

In addition to simultaneously releasing two components from the rack, the latches may be placed in communication with the interface bracket in a manner that supports release of only a single hardware component. FIG. 5a is a schematic side view (500) of the employment of the latch together with the interface bracket to limit release from the rack of a single hardware component. More specifically, the view shown in FIG. 5a is a closed view with each of the hardware components secured in the rack. As shown, the interface bracket (510) has a first projection (512) and a second projection (514). The first projection (512) is mounted adjacent to a first hardware component (not shown), and the second projection (514) is mounted adjacent to a second hardware component (not shown). As described above in detail, each latch includes two apertures, one to communicate with the interface bracket (510) and the second to interface with the hardware component. A first latch (520) is shown with a first aperture (522) and a second aperture (526). The first aperture (522) is sized to receive a projection (524) from the first hardware component (not shown), and the second aperture (526) is sized to receive the first projection (512) from the interface bracket (510). As shown herein in the closed position, the first aperture (522) is in receipt of the projection (524), however, the second aperture (526) is not in receipt of the first projection (512) from the interface bracket (510). More specifically, the first projection (512) is shown mounted below a bottom wall (528) of the latch (520), with a top wall surface (512a) of the first projection adjacent to the bottom wall (528). A second latch (530) is shown with a first aperture (532) and a second aperture (536). The first aperture (532) is sized to receive a projection (534) from the second hardware component (not shown), and the second aperture (536) is sized to receive the second projection (514) from the interface bracket (510).

Accordingly, in this closed view, the second aperture of the first latch is empty, with the remaining aperture of the first and second latches (520) and (530), respectively, shown in receipt of the respective projections of the interface bracket and the associated hardware component in the rack.

With the mounting of the latches to the interface bracket as shown in FIG. 5*a*, the fastening elements of the computer hardware components may be individually released from the rack. FIG. 5*b* is a schematic side view (540) of the latch together with the interface bracket simultaneously releasing the fastening of the first and second hardware component from the rack. In this view, the first latch (520) has been actuated in the form of a push in the downward direction (542). By actuating the first latch (520), the first latch is moved in a downward direction. At the same time, the interface bracket (510) moves the second latch (530) in the downward direction by sliding along the vertical rail (120) of the interface bracket (510), as described in detail in FIG. 1. Movement of both the first and second latches (520) and (530), respectively, causes a release of the projections (524) and (534), respectively, from the first apertures (522) and (532) of the first and second latches (520) and (530), respectively. At the same time, the first and second latches (520) and (530) each remain in communication with the interface bracket (510) by retaining the first projection (512) external to the first latch (520) and the second projection (514) in the second aperture (536). Accordingly, actuation of the first latch (520) with the interface bracket projection external to the aperture simultaneously actuates the second latch (530) to release the computer hardware component from the rack.

FIG. 5*c* is a schematic view (560) of the latch together with the interface bracket limiting release of two adjacently mounted hardware components from the rack to only one of the hardware component. As shown herein, the first and second latches (520) and (530), respectively, are vertically stacked. In this view, the second latch (530) has been actuated in the form of a push in the downward direction (562). By actuating the second latch (530), the second latch is moved in a downward direction. At the same time, the interface bracket (510) moves the first latch (520) in the downward direction by the sliding along the vertical rail (120) of the interface bracket (510), as described in detail in FIG. 1. Movement of the second latch (530) causes a release of the projection (534) from the first aperture (532) of the second latch (530). At the same time, since the first latch (520) is not in receipt of the projection (512) in the second aperture (526), movement of the second latch (530) in a vertically downward motion does not release the fastening of the first hardware component from the rack. Accordingly, release of the fastening of adjacently mounted computer hardware components from the rack may be limited to one of the components when the interface bracket projection adjacent to the higher positioned hardware component on the rack is not received in the associated aperture of the first latch.

Embodiments within the scope of the present invention include various hardware components sized and configured to be installed on a rack. By way of example, and not limitation, such hardware components can include blades of a bladed computer system, computer nodes, switches, disk storage, including RAM, ROM, EEPROM, CD-ROM, or other optical disk storage, magnetic disk storage or other magnetic storage devices, or any other medium which can be used to store data which can be accessed by a general purpose or special purpose computer. Combinations of the above should also be included in the scope of the program storage means.

In FIGS. 4 and 5, the two latches are shown in communication with an interface bracket that supports fastening of two hardware components to a rack. FIGS. 4 and 5 are limited to illustrating one set of latches to one side of the rack. It is recognized in the art that a rack is generally configured with a set of parallel vertical member with hardware components stored in a rack fastened to both of the vertical members. More specifically, one side of the hardware component may be secured to one vertical member of the rack, and a second side of the hardware component may be secured to a second and oppositely positioned vertical member of the rack. To enable removal of two or more hardware components secured on each vertical member of the rack, the hardware components must be released from each vertical member. More specifically, a first interface bracket and associated latches are secured to one of the vertical members of the rack, and a second interface bracket and associated latches are secured to a second of the vertical members of the rack. Accordingly, one set of interface brackets and latches on each side of the rack are employed to simultaneously release fastening of two or more hardware components from the rack.

Advantages Over the Prior Art

Simultaneous release of the fastening of two or more hardware components may be done by one person as it only requires actuation of two latches, one on each side of the rack. Conversely, in the prior art, simultaneous release of two or more hardware components requires actuation of at least four fastening elements, which requires at least four hands which would require employment of two individuals. Through use of the interface brackets together with the latches on each side of the rack, fastening of two or more hardware components from the rack may be simultaneously released.

Alternative Embodiments

It will be appreciated that, although specific embodiments of the invention have been described herein for purposes of illustration, various modifications may be made without departing from the spirit and scope of the invention. In particular, the three or more adjacent vertically mounted hardware components may be simultaneously released from the rack. To support three or more components, the interface bracket is extended to encompass the vertical length of the three or more components, with a single interface projection provided for each hardware component. In addition, a latch is provided to interface with each interface projection provided on the interface bracket. Accordingly, the scope of protection of this invention is limited only by the following claims and their equivalents.

We claim:

1. A system, comprising:
a rack having two opposing sides to hold at least a first hardware component adjacently mounted in a vertical manner to a second computer hardware component;
a first interface bracket fixed to a first rail of a first side of the rack, the first interface bracket having a first projection and a second projection both perpendicular to the rail, with the first projection adjacent to the first hardware component and the second projection adjacent to the second hardware component;
a first release having a first aperture adapted to interface with the first projection from the first interface bracket and a second aperture to receive a first latch from the first hardware component;

a second release having a third aperture adapted to interface with the second projection from the first interface bracket and a fourth aperture to receive a second latch from the second hardware component; and wherein the first and second projections are operatively connected on the first rail such that actuation of one of the first and second releases causes actuation of the first and second projections.

2. The system of claim 1, further comprising the first projection received by the first aperture of the first release and the second projection received by the third aperture of the second release.

3. The system of claim 2, wherein a movement of the first release actuates the second release to release both the first latch of the first hardware component from the second aperture of the first release and the second latch of the second hardware component from the second release.

4. The system of claim 2, wherein movement of the second release actuates the first release to release both the first latch of the first hardware component from the second aperture of the first release and the second latch of the second hardware component from the second release.

5. The system of claim 1, further comprising the first projection placed external to the first aperture of the first release and the second projection received by the third aperture of the second release.

6. The system of claim 5, wherein a movement of the first release actuates the second release to release both the first latch of the first hardware component from the second aperture of the first release and the second latch of the second hardware component from the second release.

7. The system of claim 5, wherein a movement of the second release is limited to release of the second latch of the second hardware component.

8. The system of claim 1, further comprising:
a second interface bracket fixed to a second rail of a second side of the rack, the second interface bracket having a third projection and a fourth projection both perpendicular to the rail, with the third projection adjacent to the first hardware component and the second projection adjacent to the second hardware component;
a third release having a third aperture adapted to interface with the third projection and a fourth aperture to receive a third latch from the first hardware component; and
a fourth release having a fourth aperture adapted to interface with the fourth projection and a fifth aperture to receive a fourth latch from the second hardware component.

9. The system of claim 8, further comprising actuation of the first and third releases to release fastening of the first and second hardware components from the first and second rails of the rack.

10. A method for releasing hardware components from a rack, comprising:
a first hardware component adjacently mounted to a second hardware component in a vertical manner in a rack having two opposing sides;
fixing a first interface bracket to a first rail of a first side of the rack, the first interface bracket having a first projection and a second projection both perpendicular to the rail, with the first projection adjacent to the first hardware component and the second projection adjacent to the second hardware component;
communicating a first release with the interface bracket and the first hardware component, including a first aperture of the first release adapted to interface with the first projection and a second aperture receiving a first latch from the first hardware component;
communicating a second release with the interface and the second hardware component, including a third aperture of the second release adapted to interface with the second projection and a fourth aperture receiving a second latch from the second hardware component; and
wherein the first and second projections are operatively connected such that actuating one of the first and second releases causes actuation of the first and second projections.

11. The method of claim 10, further comprising the first aperture of the first release receiving the first projection and the third aperture of the second release receiving the second projection.

12. The method of claim 11, further comprising moving the first release in a vertical direction for actuating the second release to release both the first latch of the first hardware component from the second aperture of the first release and the second latch of the second hardware component from the second release.

13. The method of claim 11, further comprising moving the second release in a vertical direction for actuating the first release to release both the first latch of the first hardware component from the second aperture of the first release and the second latch of the second hardware component from the second release.

14. The method of claim 10, further comprising placing the first projection external to the first aperture of the first release and the second projection received by the third aperture of the second release.

15. The method of claim 14, further comprising vertically moving the first release for actuating the second release to release both the first latch of the first hardware component from the second aperture of the first release and the second latch of the second hardware component from the second release.

16. The method of claim 14, further comprising vertically moving the second release for limiting release of the second latch of the second hardware component.

17. The method of claim 10, further comprising:
fixing a second interface bracket to a second rail of a second side of the rack, the second interface bracket having a third projection and a fourth projection both perpendicular to the rail, with the third projection adjacent to the first hardware component and the second projection adjacent to the second hardware component;
interfacing a third release with the second interface bracket, the third release having a fifth aperture adapted to receive the fifth projection and a sixth aperture for receiving a sixth latch from the first hardware component; and
interfacing a fourth release with the second interface bracket, the fourth release having a seventh aperture adapted to interface with the seventh projection and an eighth aperture for receiving a fourth latch from the second hardware component.

18. The method of claim 17, further comprising the first and third releases for releasing fastening of the first and second hardware components from the first and second rails of the rack.

* * * * *